(12) United States Patent
Miyoshi et al.

(10) Patent No.: US 8,008,689 B2
(45) Date of Patent: Aug. 30, 2011

(54) MIS GATE STRUCTURE TYPE HEMT DEVICE AND METHOD OF FABRICATING MIS GATE STRUCTURE TYPE HEMT DEVICE

(75) Inventors: Makoto Miyoshi, Nagoya (JP);
Mitsuhiro Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 470 days.

(21) Appl. No.: 12/185,152

(22) Filed: Aug. 4, 2008

(65) Prior Publication Data
US 2009/0050938 A1  Feb. 26, 2009

(30) Foreign Application Priority Data

Aug. 23, 2007  (JP) .................................. 2007-216689
May 23, 2008  (JP) .................................. 2008-135271

(51) Int. Cl.
  *H01L 29/66*  (2006.01)

(52) U.S. Cl. ................................ 257/192; 257/E29.246

(58) Field of Classification Search .................. 257/192, 257/194, E29.246, E2.247, E29.248, E29.249, 257/E29.25, E29.251, E29.252, E29.253
See application file for complete search history.

(56) References Cited

U.S. PATENT DOCUMENTS 7,135,347 B2 * 11/2006 Miyoshi et al. ................. 438/46
2007/0187718 A1 * 8/2007 Suzuki et al. ................. 257/194

* cited by examiner

*Primary Examiner* — Bradley K Smith
*Assistant Examiner* — Amar Movva
(74) *Attorney, Agent, or Firm* — Burr & Brown

(57) ABSTRACT

A normally-off operation type HEMT device excellent in characteristics can be realized. A two-dimensional electron gas region is formed in a periphery of a hetero-junction interface of a base layer and a barrier layer, so that access resistance in an access portion, that is, between a drain and a gate and between a gate and a source is sufficiently lowered, and at the same time, a P-type region is formed immediately under the gate. This realizes a normally-off type HEMT device having a low on-resistance. Further, when a film thickness of an insulating layer is defined as t (nm) and a relative permittivity of a substance forming the insulating layer is defined as k, a threshold voltage as high as +3 V or more can be attained by satisfying $k/t \leq 0.85$ (nm$^{-1}$).

17 Claims, 17 Drawing Sheets

F I G . 1 A
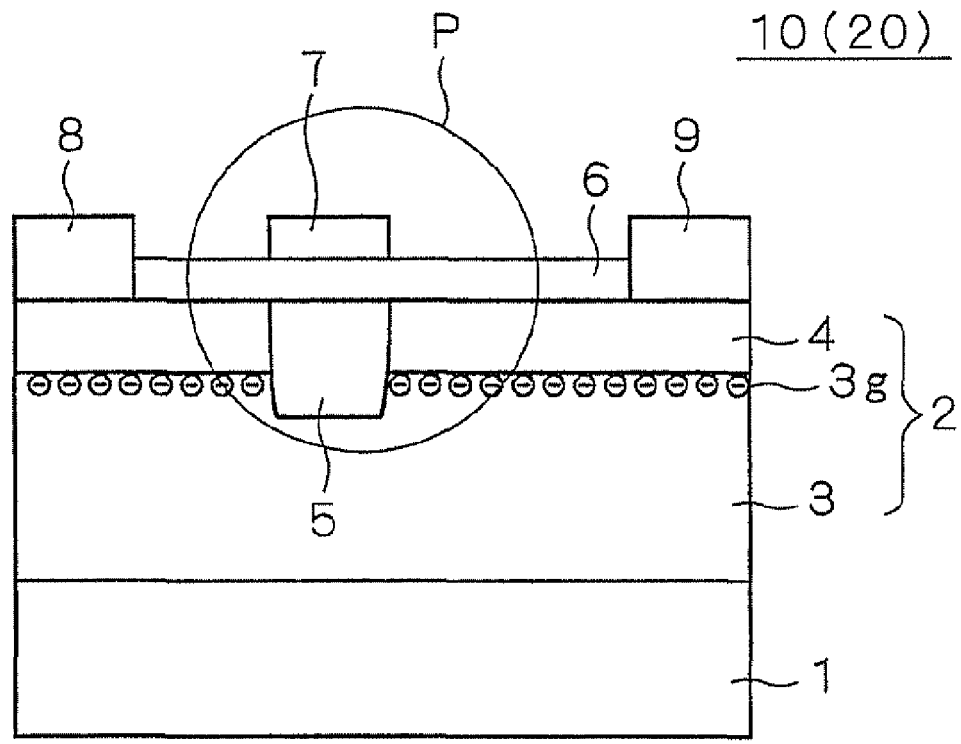
F I G . 1 B
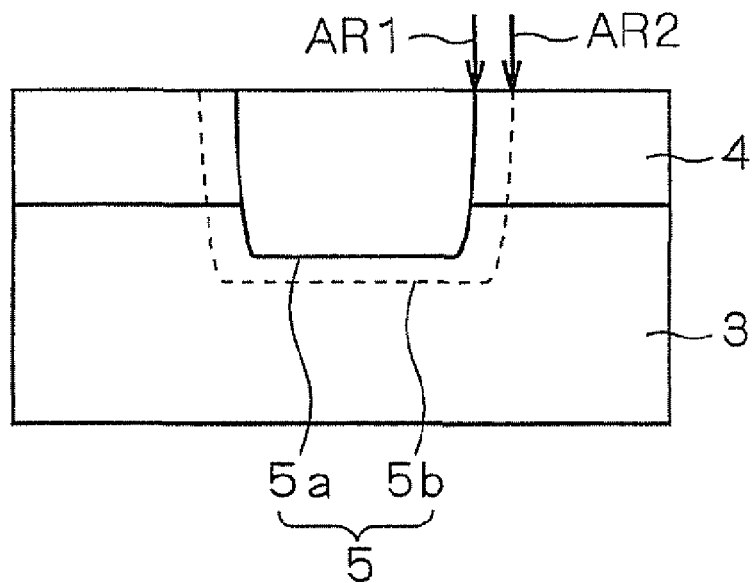

F I G. 2 A
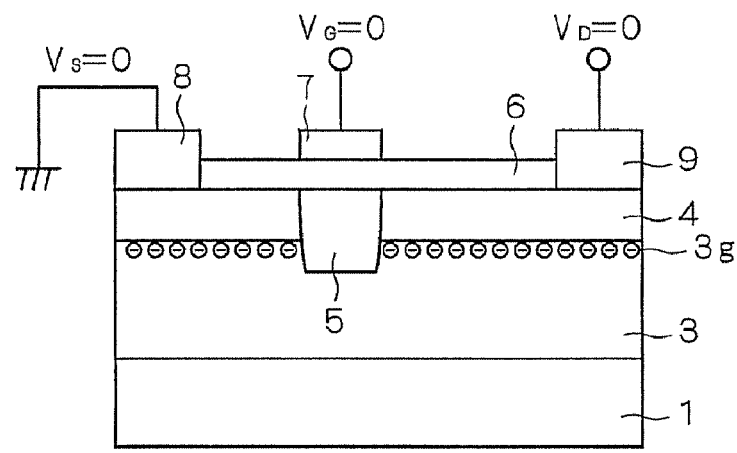
F I G. 2 B
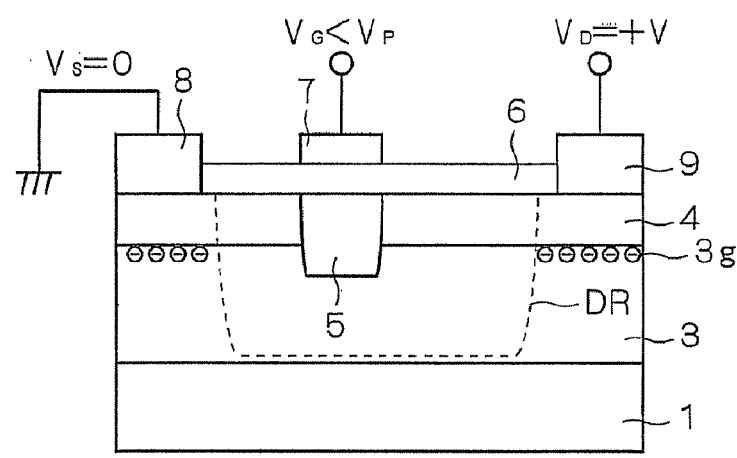
F I G. 2 C
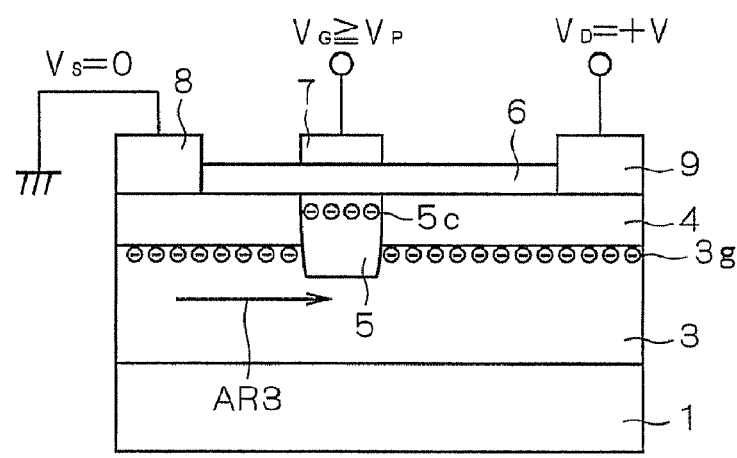

F I G. 6

| SiO$_2$ FILM THICKNESS nm | GATE LENGTH μm | THRESHOLD VOLTAGE V | MAXIMUM CURRENT A/mm (@Vg=12V) | MAXIMUM MUTUAL CONDUCTANCE mS/mm | ON-RESISTANCE Ω mm | WITHSTAND VOLTAGE V (Vg=0V) | LEAK CURRENT AT THE TIME OF INHIBITION A/mm (@Vds=550V,Vg=0V) |
|---|---|---|---|---|---|---|---|
| 2.5 | 0.2 | +1.6 | 1.3 | 220 | 4.5 | 550 | 1.7e-6 |
| 5 | 0.2 | +3.2 | 1.2 | 220 | 4.5 | 550 | 1.6e-6 |
| 7.5 | 0.2 | +4.7 | 1.1 | 220 | 4.5 | 550 | 1.9e-6 |
| 10 | 0.2 | +6.3 | 0.8 | 220 | 4.6 | 550 | 1.8e-6 |

FIG. 7

| SiO₂ FILM THICKNESS nm | GATE LENGTH μm | THRESHOLD VOLTAGE V | MAXIMUM CURRENT A/mm (@Vg=12V) | MAXIMUM MUTUAL CONDUCTANCE mS/mm | ON-RESISTANCE Ωmm | WITHSTAND VOLTAGE V (Vg=0V) | LEAK CURRENT AT THE TIME OF INHIBITION A/mm (@Vds=550V,Vg=0V) |
|---|---|---|---|---|---|---|---|
| 5 | 0.1 | +3.2 | 1.3 | 220 | 4.5 | 550 | 2.4e-6 |
| 5 | 0.2 | +3.2 | 1.2 | 220 | 4.5 | 550 | 1.6e-6 |
| 5 | 0.5 | +3.2 | 1.2 | 215 | 4.8 | 550 | 1.8e-6 |
| 5 | 1.0 | +3.2 | 1.0 | 185 | 5.3 | 550 | 1.4e-6 |

FIG. 9

| GATE LENGTH μm | THRESHOLD VOLTAGE V | MAXIMUM CURRENT A/mm (@Vg=1V) | MAXIMUM MUTUAL CONDUCTANCE mS/mm | ON-RESISTANCE Ω mm | WITHSTAND VOLTAGE V (Vg=5V) | LEAK CURRENT AT THE TIME OF INHIBITION A/mm (@Vds=550V,Vg=5V) |
|---|---|---|---|---|---|---|
| 0.1 | -4.2 | 1.4 | 220 | 3.8 | 550 | 2.4e-6 |
| 0.2 | -4.2 | 1.3 | 220 | 3.9 | 550 | 1.6e-6 |
| 0.5 | -4.2 | 1.2 | 214 | 4.1 | 550 | 1.8e-6 |
| 1.0 | -4.2 | 0.9 | 189 | 4.5 | 550 | 1.4e-6 |

FIG. 10

| AlGaN FILM THICKNESS nm | GATE LENGTH μm | THRESHOLD VOLTAGE V | MAXIMUM CURRENT A/mm (@Vg=1V) | MAXIMUM MUTUAL CONDUCTANCE mS/mm | ON-RESISTANCE Ωmm | WITHSTAND VOLTAGE V (Vg=0V) | LEAK CURRENT AT THE TIME OF INHIBITION A/mm (@Vds=550V,Vg=5V) |
|---|---|---|---|---|---|---|---|
| 5 | 0.2 | +0.3 | 0.1 | 145 | 13.5 | 550 | 1.6e-6 |
| 7.5 | 0.2 | -0.2 | 0.15 | 135 | 14.5 | 550 | 1.9e-6 |
| 10 | 0.2 | -0.8 | 0.23 | 130 | 15.7 | 550 | 1.8e-6 |

F I G. 1 1

| AlGaN FILM THICKNESS nm | GATE LENGTH μm | THRESHOLD VOLTAGE V | MAXIMUM CURRENT A/mm (@Vg=1V) | MAXIMUM MUTUAL CONDUCTANCE mS/mm | ON-RESISTANCE Ωmm | WITHSTAND VOLTAGE V (Vg=0V) | LEAK CURRENT AT THE TIME OF INHIBITION A/mm (@Vds=550V,Vg=5V) |
|---|---|---|---|---|---|---|---|
| 5 | 0.1 | +0.3 | 0.11 | 155 | 13.5 | 550 | 2.4e-6 |
| 5 | 0.2 | +0.3 | 0.1 | 145 | 13.5 | 550 | 1.6e-6 |
| 5 | 0.5 | +0.3 | 0.9 | 130 | 14.5 | 550 | 1.8e-6 |
| 5 | 1.0 | +0.3 | 0.8 | 114 | 15.8 | 550 | 1.4e-6 |

F I G . 1 2

| SiO₂ FILM THICKNESS nm | GATE LENGTH μm | THRESHOLD VOLTAGE V | MAXIMUM CURRENT A/mm (@Vg=12V) | MAXIMUM MUTUAL CONDUCTANCE mS/mm | ON-RESISTANCE Ω mm | WITHSTAND VOLTAGE V (Vg=0V) | LEAK CURRENT AT THE TIME OF INHIBITION A/mm (@Vds=550V,Vg=0V) |
|---|---|---|---|---|---|---|---|
| 2.5 | 0.2 | +1.6 | 0.45 | 75 | 13.2 | 550 | 1.7e-8 |
| 5 | 0.2 | +3.2 | 0.44 | 77 | 13.2 | 550 | 1.5e-8 |
| 7.5 | 0.2 | +4.7 | 0.44 | 77 | 13.2 | 550 | 2.5e-8 |
| 10 | 0.2 | +6.3 | 0.28 | 77 | 13.2 | 550 | 1.9e-8 |

F I G . 1 3

| SiO₂ FILM THICKNESS nm | GATE LENGTH μm | THRESHOLD VOLTAGE V | MAXIMUM CURRENT A/mm (@Vg=12V) | MAXIMUM MUTUAL CONDUCTANCE mS/mm | ON-RESISTANCE Ωmm | WITHSTAND VOLTAGE V (Vg=0V) | LEAK CURRENT AT THE TIME OF INHIBITION A/mm (@Vds=550V,Vg=0V) |
|---|---|---|---|---|---|---|---|
| 5 | 0.1 | +3.2 | 0.44 | 77 | 13.1 | 550 | 3.5e-8 |
| 5 | 0.2 | +3.2 | 0.44 | 77 | 13.2 | 550 | 1.5e-8 |
| 5 | 0.5 | +3.2 | 0.42 | 77 | 13.4 | 550 | 1.0e-8 |
| 5 | 1.0 | +3.2 | 0.40 | 77 | 13.9 | 550 | 1.8e-8 |

F I G . 1 4

| SiO₂ FILM THICKNESS nm | GATE LENGTH μm | THRESHOLD VOLTAGE V | MAXIMUM CURRENT A/mm (@Vg=12V) | MAXIMUM MUTUAL CONDUCTANCE mS/mm | ON-RESISTANCE Ωmm | WITHSTAND VOLTAGE V (Vg=0V) | LEAK CURRENT AT THE TIME OF INHIBITION A/mm (@Vds=550V,Vg=0V) |
|---|---|---|---|---|---|---|---|
| 2.5 | 0.2 | +1.6 | 1.5 | 250 | 4.2 | 550 | 3.0e-6 |
| 5 | 0.2 | +3.2 | 1.4 | 250 | 4.2 | 550 | 3.4e-6 |
| 7.5 | 0.2 | +4.7 | 1.1 | 250 | 4.2 | 550 | 3.5e-6 |
| 10 | 0.2 | +6.3 | 0.9 | 250 | 4.2 | 550 | 3.7e-6 |

F I G. 15

| SiO₂ FILM THICKNESS nm | GATE LENGTH μm | THRESHOLD VOLTAGE V | MAXIMUM CURRENT A/mm (@Vg=12V) | MAXIMUM MUTUAL CONDUCTANCE mS/mm | ON-RESISTANCE Ωmm | WITHSTAND VOLTAGE V (Vg=0V) | LEAK CURRENT AT THE TIME OF INHIBITION A/mm (@Vds=550V,Vg=0V) |
|---|---|---|---|---|---|---|---|
| 5 | 0.1 | +3.2 | 1.4 | 250 | 4.1 | 550 | 4.5e-6 |
| 5 | 0.2 | +3.2 | 1.4 | 250 | 4.2 | 550 | 3.4e-6 |
| 5 | 0.5 | +3.2 | 1.3 | 245 | 4.5 | 550 | 3.8e-6 |
| 5 | 1.0 | +3.2 | 1.2 | 240 | 4.9 | 550 | 3.2e-6 |

FIG. 16

| CONFIGURATION OF BARRIER LAYER | THRESHOLD VOLTAGE V | MAXIMUM CURRENT A/mm (@Vg=12V) | MAXIMUM MUTUAL CONDUCTANCE mS/mm | ON-RESISTANCE Ω mm | WITHSTAND VOLTAGE V (Vg=0V) | LEAK CURRENT AT THE TIME OF INHIBITION A/mm (@Vds=550V,Vg=0V) |
|---|---|---|---|---|---|---|
| $Al_{0.2}Ga_{0.8}N$ $25nm^t$ (STANDARD) (SHEET-RESISTANCE: 420 Ω/sq.) | +3.2 | 1.2 | 220 | 4.5 | 550 | 1.6e-6 |
| $Al_{0.3}Ga_{0.7}N$ $20nm^t$ (SHEET-RESISTANCE: 380 Ω/sq.) | +3.2 | 1.25 | 225 | 4.4 | 550 | 5.4e-6 |
| $Al_{0.4}Ga_{0.6}N$ $15nm^t$ (SHEET-RESISTANCE: 340 Ω/sq.) | +3.2 | 1.3 | 230 | 4.3 | 550 | 1.2e-5 |
| $Al_{0.45}Ga_{0.55}N$ $15nm^t$ (SHEET-RESISTANCE: 330 Ω/sq.) | +3.2 | 1.3 | 235 | 4.3 | 550 | 3.4e-5 |
| $In_{0.18}Al_{0.82}N$ $15nm^t$ AlN SPACER LAYER $1nm^t$ (SHEET-RESISTANCE: 250 Ω/sq.) | +3.2 | 1.4 | 250 | 4.2 | 550 | 3.4e-6 |

F I G . 1 7

| INSULATING FILM TYPE | FILM FORMATION METHOD | RELATIVE PERMITTIVITY | MINIMUM FILM THICKNESS SATISFYING THE EQUATION 1 (nm) |
|---|---|---|---|
| $SiO_2$ | PLASMA CVD | 4 | 4.7 |
| $SiN_x$ | PLASMA CVD | 5.1 | 6.0 |
| $Al_2O_3$ | VACUUM EVAPORATION | 8.5 | 10.0 |
| $HfO_2$ | VACUUM EVAPORATION | 22 | 25.9 |

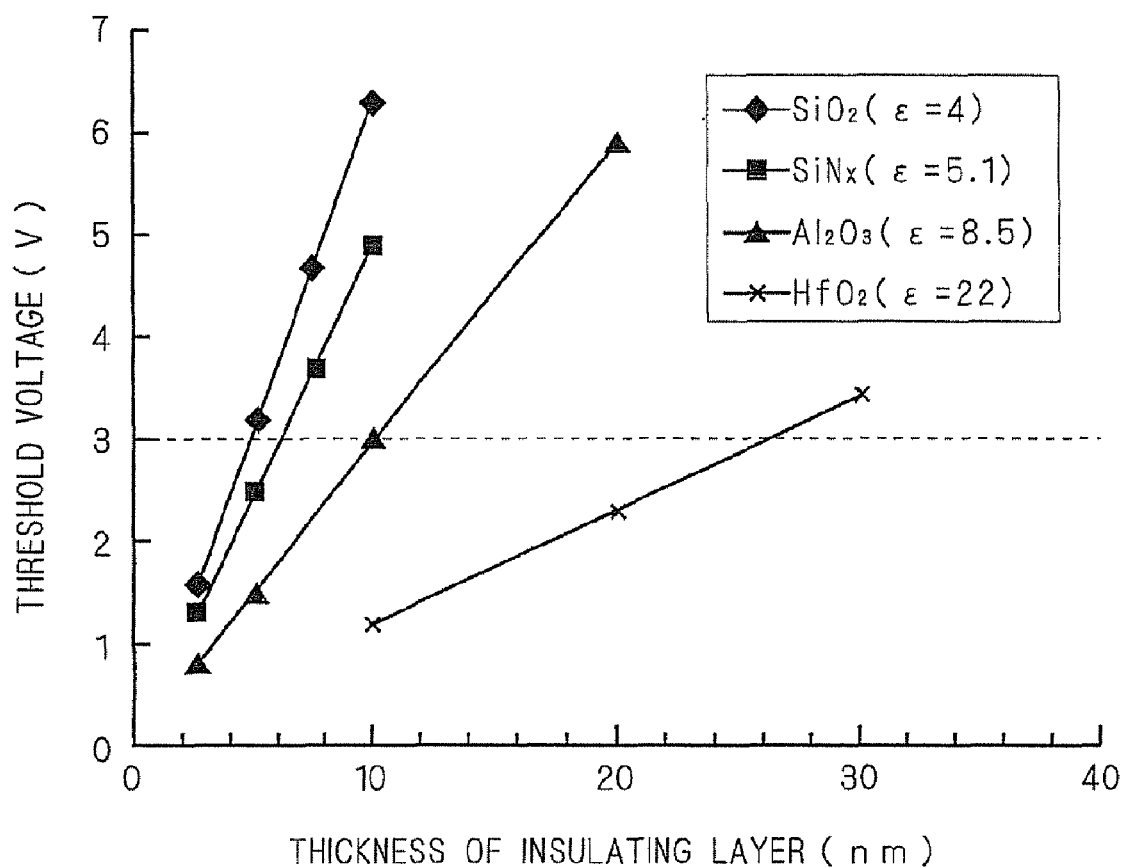
F I G . 1 8

US 8,008,689 B2

MIS GATE STRUCTURE TYPE HEMT DEVICE AND METHOD OF FABRICATING MIS GATE STRUCTURE TYPE HEMT DEVICE

BACKGROUND OF THE INVENTION

1. Field of the Invention

The present invention relates to a MIS gate structure type HEMT device and particularly a normally-off type HEMT device.

2. Description of the Background Art

Since a nitride semiconductor has a high insulation breakdown electric field and a high saturated electron velocity, the nitride semiconductor has attracted attention as a semiconductor material for high frequency/high power devices of next generation. In particular, a layered structure of Group III nitride materials such as AlGaN/GaN and AlInN/GaN can store a high concentration of two-dimensional electron gas in a layered interface due to significant polarization effects (spontaneous polarization effect and piezo-polarization effect) peculiar to the nitride materials. Development of a high electron mobility transistor (HEMT) using this characteristic has been actively carried out. (see "Highly Reliable 250W GaN High Electron Mobility Transistor Power Amplifier" Japanese Journal of Applied Physics, Vol. 44, No. 7A, 2005, pp. 4896-4901 (article 1), and "Design and Demonstration of High Breakdown Voltage GaN High Electron Mobility Transistor (HEMT) Using Field Plate Structure for Power Electronics Applications" Japanese Journal of Applied Physics, Vol. 43, No. 4B, 2004, pp. 2239-2242 (article 2)).

In a transistor device to be used for power applications (power transistor), it is desired to simultaneously make high withstand voltage and low-on resistance satisfactory. Additionally, in order to provide fail safe and simplify and miniaturize an electric power circuit, it is also, in general, desired for the device to be a normally-off operation type device in which no main current flows unless gate voltage is applied, that is, a threshold voltage is positive.

Techniques for making a shift of the threshold voltage to a positive side by making an AlGaN barrier layer thin have already been known (see "Non-Recessed-Gate Enhancement-Model AlGaN/GaN High Electron Mobility Transistors with High RF Performance" Japanese Journal of Applied Physics, Vol. 43, No. 4B, 2004, pp. 2255-2258 (article 3), and article 2: "Enhancement-Model AlGaN/AlN/GaN High Electron Mobility Transistor with low On-state Resistance and High Breakdown Voltage" Japanese Journal of Applied Physics, Vol. 45, No. 44, 2006, pp. L1168-L1170 (article 4)).

For example, in the case where an n-channel transistor such as GaN type HEMT device is made to be a normally-off operation type, it is more desirable that no main current flows unless the gate voltage is 3 V or high but not near 0 V in terms of prevention of erroneous operation by outside noise. That is, the threshold voltage is desirably +3 V or more.

The above-mentioned article 1 and article 2 disclose only normally-on operation type and GaN type HEMT devices showing a low on-resistance. Naturally, there is no disclosure or suggestion of a normally-off operation type GaN type HEMT device having a low on-resistance and a threshold voltage of +3 V or more.

Further, in the case where HEMT devices are formed by techniques disclosed in the above-mentioned article 3 and article 4, the piezo-effect is suppressed due to thinning of an AlGaN barrier layer and therefore, there occurs a problem that sufficiently high two-dimensional electron gas concentration cannot be assured and a low on-resistance cannot be obtained. Furthermore, since a Schottky junction is employed for gate parts, gate voltage (no higher than +1.2 V) exceeding a Schottky barrier height cannot be applied and thus it results in a problem that a threshold voltage of +3 V or more, which is said to be a safe operation range of normally-off devices, cannot be attained.

SUMMARY OF THE INVENTION

The present invention relates to a MIS gate structure type HEMT device and particularly a normally-off type HEMT device.

The MIS gate structure type HEMT device according to the present invention includes the following: (a) a semiconductor layer including: (a-1) a base layer made of a first Group III nitride and having conductivity of N-type and a specific resistance of $1 \times 10^7$ $\Omega$cm or more or having conductivity of P-type; (a-2) a barrier layer made of a second Group III nitride having a wider band gap than the first Group III nitride; and (a-3) a P-type region having conductivity of P type; (b) a source electrode and a drain electrode, formed on the barrier layer; (c) a gate electrode; and (d) an insulating layer located between the gate electrode and the semiconductor layer, wherein the barrier layer is formed adjacent to the base layer and the insulating layer, the base layer has a two-dimensional electron gas region in a periphery of an interface with the barrier layer, and the P-type region is formed immediately under the insulating layer and penetrates the barrier layer and the two-dimensional electron gas region in a range substantially concealed in the gate electrode when the gate electrode is observed in plane view from a surface side.

According to the present invention, sufficiently lowered access resistance in an access portion, that is, between a drain and a gate and between a gate and a source, is implemented by forming the two-dimensional electron gas region in the periphery of the hetero-junction interface between the base layer and the barrier layer, and a so-called inversion channel type MIS transistor structure is also implemented by forming a P-type region immediately under the gate. Thus, a normally-off type HEMT device having a low on-resistance is realized.

Preferably, with respect to the MIS gate structure type HEMT device according to the present invention, when a film thickness of the insulating layer is defined as t (nm) and a relative permittivity of a substance forming the insulating layer is defined as k, $k/t \leq 0.85$ $(nm^{-1})$.

In such a case, a normally-off type HEMT device having a high threshold voltage of +3 V or more can be realized.

Accordingly, an object of the present invention is to realize a normally-off operation type HEMT device excellent in characteristics.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are views schematically showing a configuration of a HEMT device 10 according to a first embodiment;

FIGS. 2A, 2B and 2C are views showing an operation state of the HEMT device 10;

FIGS. 6 and 7 are views showing evaluation results of electric characteristics of a HEMT device according to Inventive Example 1;

FIG. 9 is a view showing the evaluation results of electric characteristics of the HEMT device according to Comparative Example 1;

FIGS. 10, 11, 12 and 13 are views showing the evaluation results of electric characteristics of a HEMT device according to Comparative Example 2;

FIGS. 14 and 15 are views showing the evaluation results of electric characteristics of a HEMT device according to Inventive Example 3;

FIG. 16 is a view showing the evaluation results of electric characteristics of a HEMT device according to Inventive Example 4;

FIG. 17 is a view showing a formation condition of an insulating layer of a HEMT device according to Inventive Example 5, and FIG. 18 is a view showing relation of a thickness of the insulating layer and a threshold voltage of the HEMT device according to Inventive Example 5.

DESCRIPTION OF THE PREFERRED EMBODIMENTS

First Embodiment

Configuration of HEMT Device

Figure 3:
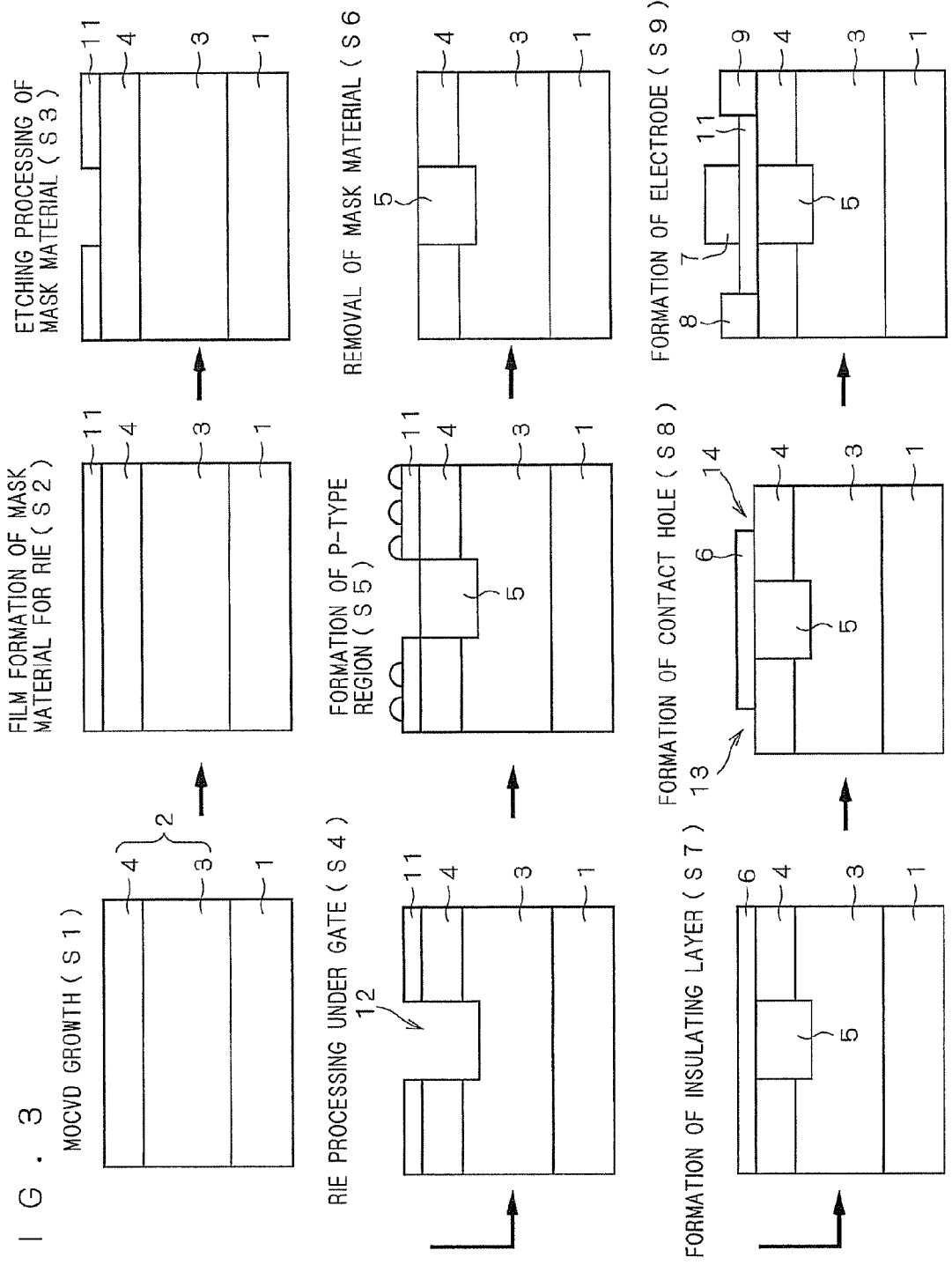
FIG. 3 is a view showing a flow of fabrication of the HEMT device 10.

FIGS. 1A and 1B are views schematically showing a configuration of a HEMT device 10 according to a first embodiment. FIG. 1A is a typical cross-sectional view of an entire configuration of the HEMT device 10. As shown in FIG. 1A, from a schematic viewpoint, the HEMT device 10 according to the embodiment is provided with a semiconductor layer 2, an insulating layer 6, a gate electrode 7, a source electrode 8, and a drain electrode 9 on a substrate 1. That is, the HEMT device 10 has a MIS gate structure configured by forming the insulating layer 6 between the semiconductor layer 2 and the gate electrode 7. Further, the semiconductor layer 2 is provided with a base layer 3, a barrier layer 4, and a P-type region 5.

Use of a single crystal 6H—SiC substrate is one of preferable examples for the substrate 1, however, materials are not particularly limited as long as they can be used to form Group III nitride semiconductor layers such as the base layer 3 and the barrier layer 4 with good crystallinity. That is, among sapphire, SiC, Si, GaAs, spinel, MgO, ZnO, ferrites and the like, the material may be properly selected and used.

The base layer 3 and the barrier layer 4 are laminated on the substrate 1 in this order. The base layer 3 is a high resistance layer made of a Group III nitride, having conductivity of N-type and a high specific resistance of $1 \times 10^7$ Ωcm or more. The base layer 3 is preferably formed so as to have an electron concentration of $1 \times 10^{12}/cm^3$ or less due to a remaining donor. Further, a preferable example of the base layer 3 is one formed in a thickness of several μm, for example, about 3 μm. On the other hand, the barrier layer 4 is a layer composed of a Group III nitride having a wider band gap than that of the Group III nitride forming the base layer 3 and having conductivity of N-type. A preferable example of the barrier layer 4 is one formed in a thickness of several tens nm, for example, about 15 to 25 nm. For example, it is a preferable example that the base layer 3 is composed of GaN and the barrier layer 4 is composed of $Al_xGa_{1-x}N$ (0<x<1). However, in this case, x≦0.5 is preferable. In the case where x>0.5, a surface state of the barrier layer 4 may possibly be deteriorated. Further, the barrier layer 4 may have a configuration of $In_pAl_qGa_rN$ (0≦p≦1, 0≦q≦1, 0≦r<1, p+q+r=1).

In the hetero junction interface obtained by layering such a base layer 3 and a barrier layer 4, spontaneous polarization and piezo-polarization are caused and thus so-called two-dimensional electron gas can be stored in a high concentration in a range of several nm from layer interfaces in both layers of the base layer 3. That is, a two-dimensional electron gas region 3g is formed. Accordingly, in the HEMT device 10, the access resistance becomes sufficiently low in the access portions, that is, between the drain and the gate region and between the gate and the source.

In order to attain good crystallinity of the semiconductor layer 2, a buffer layer (not illustrated) made of AlN with a thickness of several tens nm may be formed between the substrate 1 and the semiconductor layer 2 (actually the base layer 3).

The P-type region 5 is a region formed so as to have conductivity of P-type. The P-type region 5 is so formed as to penetrate the barrier layer 4 and the two-dimensional electron gas region 3g and thereby reach the base layer 3, and be approximately continuous to the top face of the barrier layer 4 in the top face. From another viewpoint, the P-type region 5 is so formed as to have a thickness thicker than that of the barrier layer 4.

Further, the P-type region 5 is formed in a manner that the top face part of the P-type region 5 is under the gate electrode 7, and is substantially covered with the gate electrode 7 when the HEMT device 10 is observed in plane view front a surface side (top face side).

FIG. 1B is a typical cross-sectional view of the HEMT device 10 in the periphery of a part surrounded with a circle P in FIG. 1A. Illustration of the insulating layer 6 and the gate electrode 7 is omitted. The P-type region 5 is composed of a main P-type region 5a and an auxiliary P-type region 5b, as shown in FIG. 1B. The main P-type region 5a and the auxiliary P-type region 5b are in common in a point that both have conductivity of P-type, however, their origins are different. Relation in a size of the main P-type region 5a and the auxiliary P-type region 5b is only for convenience for illustration and an actual ratio is different.

The main P-type region 5a is formed with a configuration that a region of GaN containing Mg for acting as an acceptor is formed partially in a layered structure of the layered base layer 3 and barrier layer 4 on the substrate 1 in a manner that the region is embedded in the top face side of the barrier layer 4. This can be realized, for example, as described later, by removing portions of the barrier layer 4 and the base layer 3 laminated once by etching thereby to form a recessed part, and growing a crystal of GaN while doping with Mg which will act as an acceptor in the recessed part.

On the other hand, the auxiliary P-type region 5b is formed by converting a peripheral region of the main P-type region 5a, that is, a region having been formed so as to have conductivity of N-type as the base layer 3 and the barrier layer 4, to P-type. The conversion is implemented by diffusion of Mg contained in GaN composing the main P-type region 5a to the peripheral region during an activation treatment carried out for activating Mg contained in GaN as an acceptor after the formation of the main P-type region 5a. In other words, the auxiliary P-type region 5b is a region existing in an outer circumference of the interface (portion shown with an arrow AR1 in FIG. 1A) between the main P-type region 5a and the peripheral region, in an actual structure. The interface between the auxiliary P-type region 5b formed in such a manner and its outer circumference region (portion shown with an arrow AR2 in FIG. 1B) is a PN junction interface. As described above, existence of two interfaces at different positions can be confirmed by analysis of a cross section of the HEMT device as shown in FIGS. 1A and 1B, with a SED, EDX, or ToF-SIMS.

The P-type region 5 is preferably formed so as to have a Mg concentration of about $1\times10^{18}$/cm$^3$ to $1\times10^{20}$/cm$^3$, for example, $5\times10^{19}$/cm$^3$, and a hole concentration of about $5\times10^{17}$/cm$^3$ to $5\times10^{18}$/cm$^3$, for example, about $1\times10^{18}$/cm$^3$.

The insulating layer 6 is a layer formed by covering the top faces of the barrier layer 4 and the P-type region 5. The insulating layer 6 can be formed by, for example, an insulating material such as $SiO_2$, in a thickness of several nm to hundred nm. Additionally, as described later, since the threshold voltage of the HEMT device 10 is determined in relation of the thickness of the insulating layer 6 and the relative permittivity of a substance forming the insulating layer 6, a film thickness and a constituent material for the insulating layer 6 are preferably selected so as to realize a desired threshold voltage.

The gate electrode 7 is formed on the top face of the insulating layer 6. Further, the source electrode 8 and the drain electrode 9 are formed by forming a contact hole in a portion of the insulating layer 6 and establishing an ohmic contact to the barrier layer 4. One preferable example is that the gate electrode 7, the source electrode 8, and the drain electrode 9 are formed as a multilayered electrode of Ti/Al/Ni/Au.

Operation and Characteristics of HEMT Device

Next, the operation of the HEMT device 10 having the above-mentioned configuration will be described. FIGS. 2A, 2B and 2C are views showing an operation state of the HEMT device 10.

First, in a bias-free state that a gate voltage $V_G$ and a drain voltage $V_D$, are 0 (the source electrode 8 is earthed (source voltage $V_S$ is 0)), shown in FIG. 2A, the two-dimensional electron gas region 3g is formed in the periphery of the interface between the base layer 3 and the barrier layer 4 as described above.

Next, when bias voltage is applied to the drain electrode 9 ($V_D$=+V), as shown in FIG. 2B, if the gate voltage $V_G$ is lower than the threshold voltage $V_p$ ($V_G<V_p$), a depletion region DR is spread from the P-type region 5 to the peripheral part and no main current flows between the drain and the source. However, as shown in FIG. 2C, if the gate voltage $V_G$ is equal to or more than the threshold voltage $V_p$ ($V_G \geq V_p$), an inversion channel region 5c with a thickness of about 10 nm can be formed in the periphery of the surface of the P-type region 5 and electrons are moved as shown by an arrow AR3 and thus main current $I_D$ flows.

That is, in the HEMT device 10, a so-called inversion channel type MIS transistor structure can be realized.

FIGS. 6 and 7 are views showing one example of the results of evaluation of electric characteristics of the HEMT devices 10. The results shown in FIG. 6 are of the HEMT devices 10 fabricated by using a 6H—SiC single crystal substrate as the substrate 1, forming a GaN layer with a thickness of 3 µm as the base layer 3, a remaining electron concentration of about $5\times10^{11}$/cm$^3$, and a specific resistance of $1\times10^7$ Ωcm or more and an $Al_{0.2}Ga_{0.8}N$ layer with a thickness of 25 nm as the barrier layer 4, while changing the thickness of a $SiO_2$ layer as the insulating layer 6 (see Inventive Example 1). Further, the results shown in FIG. 7 are of the HEMT devices 10 fabricated by variously changing a gate length and on the other hand setting the thickness of the $SiO_2$ layer as the insulating layer 6 to be 5 nm. The results shown in FIGS. 6 and 7 mean that the normally-off operation type HEMT devices having a low on-resistance and a high threshold voltage are realized.

In particular, from the results shown in FIG. 6, in the case where the thickness of the $SiO_2$ layer (described as a film thickness of the $SiO_2$ layer in FIG. 6) is set to at least 5 nm or more, it is understood that the HEMT devices 10 with a threshold voltage of +3 V or more can be realized.

When the film thickness of the insulating layer 6 is defined as t (nm) and the relative permittivity of a substance forming the insulating layer 6 is defined as k, it is confirmed by the inventors of the present invention that a high threshold voltage $V_p$ of +3.0 V or more can be achieved if the following expression is satisfied.

$$k/t \leq 0.85 \text{ (nm}^{-1}\text{)} \qquad \text{(expression 1)}$$

For example, in the case where $SiO_2$ with a relative permittivity of about 3.8 to 4.0 is used for the insulating layer 6, if the insulating layer 6 is formed in a thickness of about 5 nm or more, it is made possible to realize a threshold voltage $V_p$ of +3 V or more.

Moreover, according to the results shown in FIGS. 6 and 7, with respect to the HEMT devices 10, preferable values of the maximum current, the maximum mutual conductance, on-resistance, withstand voltage, leak current at the time of inhibition of an inverse direction and the like, which characterize the electric characteristics of the HEMT devices, are obtained. Among them, the on-resistance is 4.5 Ωmm to 5.3 Ωmm, and thus it is small value similar to that of a normally-on operation type device. It is supposedly attributed to that a two-dimensional electron gas region 3g with a sufficient two-dimensional electron gas concentration is formed and the access resistance in the access portions is thus lowered sufficiently.

Method of Fabricating HEMT Device

Next, a method of fabricating the HEMT device 10 according to the present embodiment having the above-mentioned excellent characteristics will be described. The method described below is merely illustrative and the method of fabricating the HEMT device 10 having the above-mentioned characteristics is not limited to this.

FIG. 3 is a view showing a flow of fabrication of the HEMT device 10. Hereinafter, a case of using a 6H—SiC single crystal substrate of a (0001) plane direction as the substrate 1, forming a GaN layer as the base layer 3, an $Al_{0.2}Ga_{0.8}N$ layer as the barrier layer 4, and a $SiO_2$ layer as the insulating layer 6 will be described as an example. Hereinafter, a case of simultaneously fabricating a large number of HEMT devices 10 by using the substrate 1 will be described.

A fabrication procedure shown in FIG. 3 can be schematically outlined as follows: first, the base layer 3 and the barrier layer 4 are layered to form a hetero junction and then a portion of the layered part is removed and instead, the P-type region 5 is formed and successively formation of an insulating layer and an electrode is carried out.

First, on the substrate 1, the base layer 3 and the barrier layer 4 composing the semiconductor layer 2 are formed successively in an epitaxial manner by a MOCVD (metal-organic chemical vapor deposition) method, a conventionally known method (step S1). Hereinafter, a layered structure obtained in this method is referred to as a substrate for device formation.

The base layer 3 can be formed by, for example, setting the substrate 1 on a susceptor in a MOCVD furnace and thereafter heating the substrate 1 at a prescribed temperature of 1000° C. to 1200° C., for example, at 1100° C. under a prescribed atmosphere, and then, introducing TMG bubbling gas and NH$_3$ gas into the MOCVD furnace. At that time, before the base layer 3 is deposited on the substrate 1, a buffer layer (not illustrated) made of GaN or AlN with a thickness of several ten nm to several hundred nm may be formed. Additionally, herein, the temperature of the susceptor (set heating temperature) is regarded as the temperature of the substrate 1 (substrate temperature).

The barrier layer 4 can be formed by introducing TMA, TMG, and NH$_3$ gas into the MOCVD furnace while the substrate temperature is kept after the base layer 3 is formed as described above.

When the substrate for device formation is obtained, device separation treatment for defining a surface of the substrate corresponding to sizes of the respective HEMT devices is carried out at first. Since such treatment is not principally needed to realize the HEMT device according to the embodiment, detailed description is omitted. By way of example, grooves with a depth of about 400 nm may be formed at boundary positions of the respective devices by a publicly known photolithography process and a RIE (reactive ion etching) method.

Next, in order to form a mask pattern for P-type region formation on the surface of the substrate for device formation, a mask layer 11 is film-formed (step S2). As the mask layer 11, formation of a SiO$_2$ layer with a thickness of about several hundred nm is a preferable example. The film-formation of the mask layer 11 may be carried out by a vapor phase deposition process such as a plasma CVD.

Successively, the photolithographic process is employed to remove the mask layer 11 only at a portion corresponding to a top face portion of the main P-type region 5a (in a range substantially concealed in the gate electrode 7 when the gate electrode 7 is observed in plane view from the surface side 7 after formation of the gate electrode 7) (step S3). Accordingly, a mask pattern for the P-type region formation can be formed.

Next, the portions which are not covered with the mask layer 11 are subjected to a removing process (etching) by the RIE method to form a recessed part 12 (step S4). The recessed part 12 has to have a depth sufficient for penetrating at least the barrier layer 4 and the two-dimensional electron gas region 3g. As described above, since the barrier layer 4 is formed in a thickness of about several tens nm and the two-dimensional electron gas region 3g is formed in a thickness at thickest several nm, it is sufficient to carry out the removing process to a depth (processing depth) of around 100 nm.

When the processing by RIE in the above-mentioned manner is carried out, treatment for forming the P-type region 5 is carried out (step S5).

Practically, first, after the substrate for device formation is set on the susceptor in the MOCVD furnace, the substrate is heated to a prescribed temperature in a range of 1000° C. to 1200° C., for example, at 1100° C. under a prescribed atmosphere, and then, each bubbling gas of CP$_2$Mg and TMG as well as NH$_3$ gas are introduced into the MOCVD furnace. Herein, a SiO$_2$ film having been used as the mask for RIE processing works as a mask for selective epitaxial growth. That is, the epitaxial growth of GaN containing only Mg occurs in the recessed part 12 having been formed by the RIE processing. Accordingly, the main P-type region 5a is formed However, as it is, since Mg does not function well as an acceptor, in order to activate Mg, the substrate for device formation in which the recessed part 12 is embedded is subjected to heating treatment in which heating is carried out at a prescribed temperature in a range of 500° C. to 900° C., for example at 600° C. for 10 minutes to 50 minutes, for example, 30 minutes (Mg activation treatment). During a formation process of the main P-type region 5a and Mg activation treatment, Mg is diffused to the peripheral part from the main P-type region 5a, thereby to form the auxiliary P-type region 5b. That is, the P-type region 5 composed of the main P-type region 5a and the auxiliary P-type region 5b is formed. In FIG. 3, for convenience for drawings, simply the P-type region 5 alone is illustrated without distinguishing the main P-type region 5a and the auxiliary P-type region 5b.

After the P-type region 5 is formed, the mask layer 11 is removed by wet etching (step S6). As an etchant, for example, a buffered hydrofluoric acid is preferable to be used. An approximate continuity between the top face of the P-type region 5 and the top face of the barrier layer 4 is obtained by such wet etching.

Next, to cover at least the top face of the P-type region 5, a SiO$_2$ layer as the insulating layer 6 is formed on the P-type region 5 and the barrier layer 4 (step S7). Formation of the SiO$_2$ layer can be carried out by, for example, a vapor phase deposition process such as a plasma CVD method.

After the SiO$_2$ layer is formed, contact holes 13 and 14 are formed in formation positions of the source electrode 8 and the drain electrode 9 in the SiO$_2$ layer by using a photolithography process (step S8).

After the formation of the contact holes 13 and 14, formation of the gate electrode 7, the source electrode 8, and the drain electrode 9 is carried out (step S9). Practically, first, a vacuum deposition method and a photolithography process are employed to form metal patterns of Ti/Al/Ni/Au (film thicknesses are respectively 25/75/15/100 nm) on the formation positions of the respective electrodes. Next, in order to improve the ohmic property of the source electrode 8 and the drain electrode 9, heat treatment is carried out at a prescribed temperature in a range of 600° C. to 1000° C., for example, at 850° C. for 20 seconds to 120 seconds, for example, 30 seconds.

According to the above-mentioned process, the HEMT device 10 according to the present embodiment can be formed.

Additionally, formation of the semiconductor layer 2 may be carried out by techniques other than the MOCVD method if the techniques are suitable for forming the semiconductor layer 2 with good crystallinity. For example, formation techniques selected properly from vapor phase deposition methods and liquid phase deposition methods such as MBE, HVPE, and LPE can be employed or different deposition methods may be combined.

As described above, according to the present embodiment, a HEMT device is fabricated so that the access resistances in the access portions, that is, between the drain and the gate and between the gate and the source are sufficiently lowered by forming the two-dimensional electron gas region in the periphery of the hetero-junction interface between the base layer with high resistance and the barrier layer, and at the same time, so that the P-type region is formed immediately under the gate to form a so-called inversion channel type MIS transistor structure. Thus, a normally-off type HEMT device having a low on-resistance is realized. Further, the relative permittivity and the film thickness of the insulating layer are adjusted to satisfy a specified relation, so that a normally-off type HEMT device with a high threshold voltage of +3 V or more can be realized.

Second Embodiment

In the first embodiment described above, an aspect in which the base layer 3 is formed as a high resistance layer having conductivity of N-type and a high specific resistance of $1\times10^7$ Ωcm or more are shown. However, the base layer 3 may be composed of Group III nitride having conductivity of P-type instead of this aspect. For example, the base layer 3 may be composed of GaN containing Mg as an acceptor. In this case, the layer is preferably formed in a manner that a hole concentration at room temperature is adjusted to be $1\times10^{16}$/cm$^3$ to $1\times10^{18}$/cm$^3$, for example, about $2\times10^{16}$/cm$^3$.

Since such a HEMT device 20 has almost same configuration as that of the HEMT device 10 according to the first embodiment shown in FIG. 1A, the detailed description of the respective parts are omitted. However, the configuration of the P-type region 5 is slightly made different.

Figure 4:
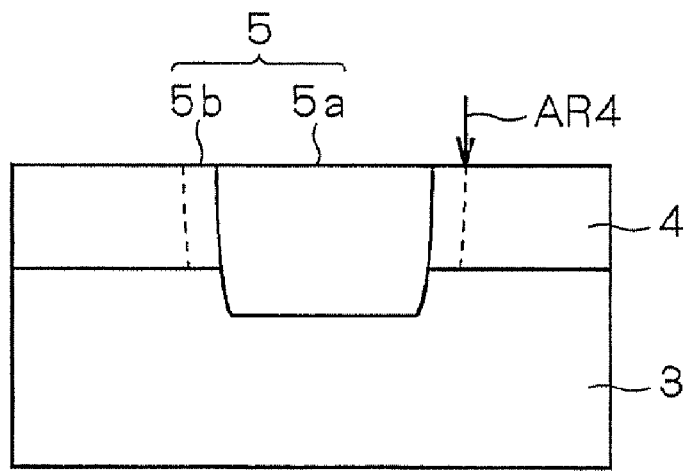
FIG. 4 is a view typically showing a configuration of a P-type region in a HEMT device 20 according to a second embodiment.

FIG. 4 is a view typically showing a configuration of a P-type region in the HEMT device 20. In the HEMT device 20, the main P-type region 5a is formed in the same manner as in the HEMT device 10 according to the first embodiment. However, since the base layer 3 originally has conductivity of P-type, the auxiliary P-type region 5b as the Mg diffusion region is formed only between the main P-type region 5a and the barrier layer 4. In other words, the PN-junction interface is formed only between the auxiliary P-type region 5b and the barrier layer 4 (shown by an arrow AR4 in FIG. 4).

In the fabrication of the HEMT device 20, in place of formation of the base layer 3 in the step S1 of the method of fabricating the HEMT device 10 according to the first embodiment shown in FIG. 3, a layer can be formed by introducing each bubbling gas of $CP_2Mg$ and TMG as well as $NH_3$ gas into the MOCVD furnace while heating the substrate 1 at a prescribed temperature in a range of 1000° C. to 1200° C., for example, at 1100° C. under a prescribed atmosphere.

FIGS. 12 and 13 are views showing one example of the evaluation results of the electric characteristics of the HEMT device 20. The results of FIGS. 12 and 13 are of HEMT devices fabricated in the same manner as in the HEMT device 10 whose characteristics are shown in FIGS. 6 and 7 except for the base layer 3 (see Example 2).

The results shown in FIG. 12 implies that even if the base layer 3 is P-type, in the case where the thickness of the $SiO_2$ layer (described as the film thickness of the $SiO_2$ layer in FIG. 12) is adjusted to be at least 5 nm or more, a HEMT device with a threshold voltage of +3 V or more can be realized. Further, with respect to the HEMT device 20, according to the results shown in FIGS. 12 and 13, preferable values of the maximum current, the maximum mutual conductance, on-resistance, withstand voltage, and leak current at the time of inhibition of the inverse direction, which characterize the electric characteristics of the HEMT devices, are obtained. These results show that even if the base layer 3 is of P-type, it is possible to actually obtain a normally-off operation type HEMT device having a low on-resistance and a high threshold voltage of +3 V or more.

According to the present embodiment, a HEMT device is fabricated so that the access resistance in the access portions, that is, between the drain and the gate and between the gate and the source are sufficiently lowered by forming the two-dimensional electron gas region in the periphery of the hetero-junction interface between the base layer and the barrier layer, and at the same time, a P-type region is formed immediately under the gate to provide a so-called inversion channel type MIS transistor structure. Thus, a normally-off type HEMT device having a low on-resistance is realized, even if the base layer is made to have conductivity of P-type. Further, the relative permittivity and the film thickness of the insulating layer are adjusted to satisfy a prescribed relation, a normally-off type HEMT device having a high threshold voltage of +3 V or more can be realized.

Third Embodiment

Figure 5:
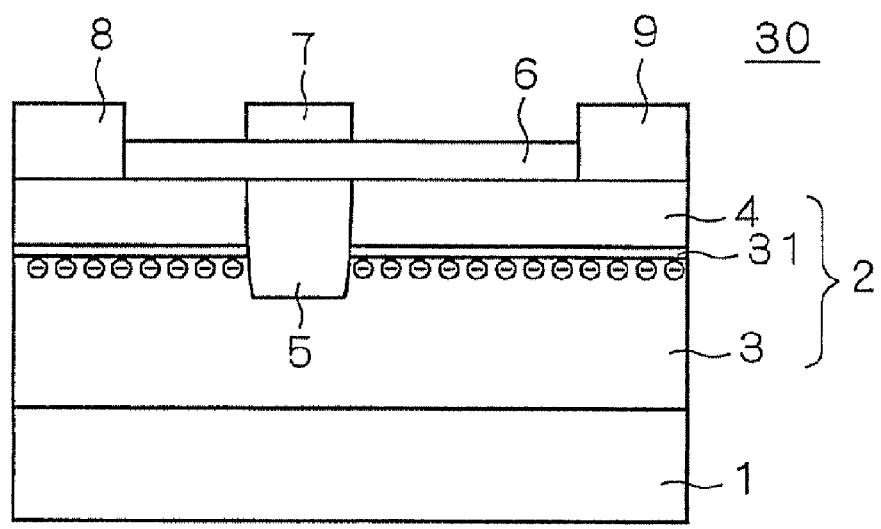
FIG. 5 is a view schematically showing a configuration of a HEMT device 30 according to a third embodiment.

FIG. 5 is a view schematically showing a configuration of a HEMT device 30 according to a third embodiment. In the present embodiment, the same symbols are assigned to the constituent components having the same functional effects as those of the constituent elements of the HEMT device 10 according to the first embodiment and detailed descriptions about the constituent components are omitted. Although the HEMT device 30 is same as the HEMT device 10 according to the first embodiment in a point that both have the MIS gate structure having the insulating layer 6 between the semiconductor layer 2 and the gate electrode 7, the HEMT device 30 differs in a point that an AlN layer (AlN spacer layer) 31 made of AlN is inserted between the base layer 3 and the barrier layer 4.

The AlN layer 31 is inserted for suppressing a decrease in an electron mobility due to partial immersion of the two-dimensional electron gas region 3g in the barrier layer 4. Accordingly, a further high mobility can be obtained in the two-dimensional electron gas region 3g and a further decrease in the access resistance can be realized. In terms of fulfillment of the purpose, the AlN layer 31 is preferable to be formed in a thickness of 0.75 nm or more and 1.5 nm or less.

Formation of such an AlN layer 31 can be carried out by introducing bubbling gas of TMA and $NH_3$ gas into the MOCVD furnace between the formation of the base layer 3 and the formation of the barrier layer 4 in the step S1 of the method of fabricating the HEMT device 10 according to the first embodiment.

FIGS. 14 and 15 are views showing one example of the evaluation results of the electric characteristics of the HEMT device 30. The results of FIGS. 14 and 15 are of the HEMT devices fabricated in the same manner as in the HEMT device 10 whose characteristics are shown in FIGS. 6 and 7, except that the AlN layer 31 is inserted and formed (see Example 3). These results imply that a HEMT device having a high threshold voltage same as the HEMT device 10 according to the first embodiment and further excellent characteristics can be obtained.

Consequently, according to the present embodiment, formation of the AlN layer between the base layer and the barrier layer implies that it is made possible to obtain a HEMT device having a high threshold voltage and further excellent characteristics.

EXAMPLES

Inventive Example 1

In the present Inventive Example, a plurality of 6H—SiC single crystal substrates of a (0001) plane direction were prepared as the substrate 1, and the HEMT devices 10 according to the first embodiment were fabricated while the thickness of the $SiO_2$ film as the insulating layer 6 and the gate length were variously changed. The thickness of the $SiO_2$ film was set in four levels: 2.5 nm, 5 nm, 7.5 nm, and 10 nm. With respect to those having a thickness of the $SiO_2$ film of 5 nm, the gate length was set in four levels: 0.1 μm, 0.2 μm, 0.5 μm, and 1 μm. With respect to those with other thicknesses, the gate length was set to be 0.2 μm. All of the HEMT devices 10 were adjusted to have a gate width of 1 mm, a source-gate interval of 0.5 μm, and a gate-drain interval of 7.5 μm. The formation of the semiconductor layer 2 was carried out in accordance with the condition of a growth rate and composition previously determined by preliminary experiments carried out previously.

First, the base layer 3 and the barrier layer 4 composing the semiconductor layer 2 were formed by the MOCVD method as the treatment corresponding to the step S1 in FIG. 3.

Practically, the substrates 1 were set in the MOCVD furnace, and after the furnace was purged with vacuum gas, a hydrogen/nitrogen mixture flowing atmosphere was formed and the temperature was increased to 1100° C. by susceptor heating.

When the substrate temperature reached 1100° C., TMA bubbling gas and $NH_3$ gas were introduced into the MOCVD furnace and an AlN layer as the buffer layer was formed in a thickness of 200 nm.

Successively, while the substrates were kept at 1100° C., TMG bubbling gas and $NH_3$ gas were introduced into the MOCVD furnace and a GaN layer was formed as the base layer 3 in a thickness of 3 μm. It has been identified about the GaN layer grown in the same conditions in a form of a single film that the layer is an n-type semiconductor layer having a residual electron concentration at room temperature about $5 \times 10^{11}/cm^3$ and a specific resistance of $1 \times 10^7$ Ωcm or more.

Further, while the substrate temperature were kept at 1100° C., TMA, TMG and $NH_3$ gas were introduced into the MOCVD furnace and an $Al_{0.2}Ga_{0.8}N$ layer was formed in a thickness of 25 nm as the barrier layer 4.

After the temperature was lowered near to room temperature, the substrates for device formation were taken out of the MOCVD furnace.

At that time, a portion of each of the substrates for device formation was cut and subjected to hole measurement. As a result, the sheet resistance was 420Ω/□ and the electron mobility was about 1400 $cm^2/Vs$.

Successively, grooves with a depth of about 400 nm were formed at the boundary positions of the respective devices for the obtained substrates for device formation by photolithographic process and a RIE method as device separation treatment.

After the device separation treatment, as the treatment corresponding to the step S2, the $SiO_2$ film having a thickness of 300 nm was formed as the mask layer 11 on the substrates for device formation by a plasma CVD method.

After formation of the $SiO_2$ film, the $SiO_2$ film was removed only at a portion corresponding to the top face portion of the main P-type region 5a (in a range substantially concealed in the gate electrode 7 when the gate electrode 7 is observed in plane view from the surface side after formation of the gate electrode 7) as treatment corresponding to the step S3, by a photolithographic process. Accordingly, a mask pattern for the P-type region formation was obtained.

Successively, at the portion which was not covered with the $SiO_2$ film, the recessed part 12 was formed by the RIE method, as treatment corresponding to the step S4. The depth of RIE processing was about 100 nm.

After formation of the recessed part 12, treatment corresponding to the step S5 was carried out. First, after the substrates for device formation were set on the susceptor in the MOCVD furnace and the vacuum gas purge was carried out, while the hydrogen/nitrogen flow mixed atmosphere was formed, the substrates were heated to 1100° C. by susceptor heating.

When the substrate temperature reached 1100° C., each bubbling gas of $CP_2Mg$ and TMG as well as $NH_3$ gas were introduced into the reactor and the main P-type region 5a containing Mg-doped GaN was formed in the portions of the recessed part 12. After the temperature was lowered near room temperature, the substrates for device formation were taken out of the MOCVD furnace, and successively, as the Mg activation treatment, heating treatment was carried out at 600° C. in nitrogen for 30 minutes.

With respect to the P-type region 5 formed at the time, it has been previously identified that the Mg concentration was about $5 \times 10^{19}/cm^3$ and the hole concentration was about $1 \times 10^{18}/cm^3$ from the results of SIMS and hole effect measurement for the substrates for device formation fabricated in the same conditions.

After the activation treatment, as the treatment corresponding to the step S6, the $SiO_2$ film as the mask layer 11 was removed by etching using a buffered hydrofluoric acid.

Further, as the treatment corresponding to the step S7, the $SiO_2$ film (relative permittivity k=4) as the insulating layer 6 was formed by the plasma CVD method.

After formation of the $SiO_2$ film, as the treatment corresponding to the step S8, the $SiO_2$ film at the formation positions of the source electrode 8 and drain electrode 9 was removed by etching with the photolithographic process thereby to form the contact holes 13 and 14.

After formation of the contact holes 13 and 14, electrode formation treatment corresponding to the step S9 was carried out. First, a vacuum evaporation method and photolithographic process were employed to form metal patterns of Ti/Al/Ni/Au (film thickness was 25/75/15/100 nm, respectively) at the respective formation positions of the gate electrode 7, the source electrode 8, and the drain electrode 9. Thereafter, heat treatment was carried out at 850° C. for 30 seconds in nitrogen in order to increase the ohmic property. Thus the respective electrodes were obtained.

Through the treatments described above, the HEMT devices 10 according to the first embodiment were obtained. With respect to the HEMT devices 10, when the devices were cut in parallel to a source-drain main current channel and the cross-sections thereof were observed by SEM and EDX. With this observation, it was confirmed that the PN junction interface existed in the outer side than the interface of the main P-type region 5a. That is, it was confirmed that the auxiliary P-type region 5b as a Mg diffusion region was formed.

Further, in order to evaluate the electric characteristics of the HEMT devices 10, after a passivation film of silicon nitride was formed by the CVD method and photolithographic process, the contact holes were formed in the respective electrode parts and wire bonding was carried out.

In such a configuration, the electric characteristics of the HEMT devices 10 were evaluated. Practically, the threshold voltage, maximum current, maximum mutual conductance, on-resistance, withstand voltage, and leak current at the time of inhibition in the inverse direction were measured. FIGS. 6 and 7 are the views showing the tabulated evaluation results of such electric characteristics. These results show that the HEMT devices 10 have been obtained as the normally-off operation type HEMT devices having a low on-resistance and a positive threshold voltage. In particular, according to FIG. 6, it can be understood that in the case where the $SiO_2$ film was used as the insulating layer, if the thickness of at least the insulating layer was controlled to be 5 nm or more, the normally-off operation type HEMT devices having a high threshold voltage of +3V or more could be realized. Further, according to FIG. 7, it can be understood that the normally-off operation type HEMT devices having a high threshold voltage of +3 V or more could be realized, regardless of the gate length.

Comparative Example 1

Figure 8:
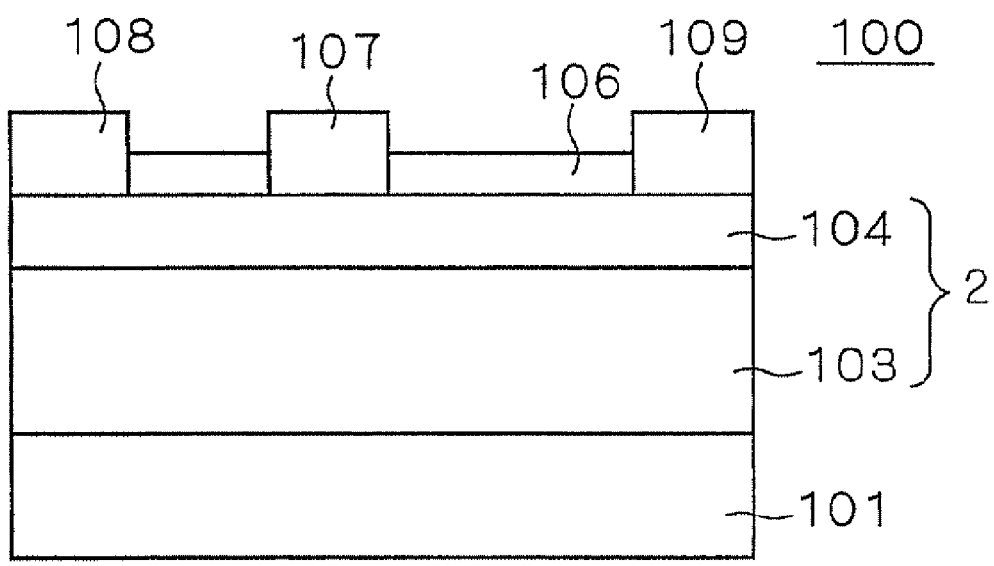
FIG. 8 is a typical cross-sectional view of an entire configuration of a normally-off operation type HEMT device according to Comparative Example 1.

In this Comparative Example, normally-on operation type HEMT devices were fabricated. FIG. 8 is a typical cross-sectional view of the entire configuration of a normally-on operation type HEMT device 100. Schematically, each HEMT device 100 includes a semiconductor layer 102 on a substrate 101; and a gate electrode 107, a source electrode 108, and a drain electrode 109 on the semiconductor layer 102. Further, the semiconductor layer 102 is formed by laminating a base layer 103 and a barrier layer 104. A protection layer 106 is formed on a portion (access region part) other than an electrode formation portion on the top face of the semiconductor layer 102.

At the time of fabricating the HEMT devices 100, the gate length was set to be four levels; 0.1 μm, 0.2 μm, 0.5 μm, and 1 μm. Further, in each HEMT device, the gate width was adjusted to be 1 mm; the source-gate interval to be 0.5 μm; and the gate-drain interval to be 7.5 μm.

First, processes up to the fabrication of the substrates for device formation and the device separation treatment thereafter were carried out in the same manner as in Inventive Example 1. That is, 6H—SiC single crystal substrates of a (0001) plane direction same as the substrates 1 of Inventive Example 1 were used as the substrates 101 and the base layer 103 and the barrier layer 104 were fabricated in the same manner as in the base layer 3 and the barrier layer 4.

Thereafter, a $SiO_2$ film with a thickness of 10 nm was formed as a mask on the substrates for device formation and the $SiO_2$ film at the formation positions of the gate electrode 107, the source electrode 108, and the drain electrode 109 was removed by etching through the photolithographic process, thereby to form mask patterns.

After formation of the mask pattern, a SiN film with a thickness of 300 nm as a protection layer 106 was formed only at access region parts by using the CVD method and photolithographic process.

After formation of the SiN film, the vacuum evaporation method and photolithographic process were employed to form metal patterns of Ti/Al/Ni/Au (film thickness was 25/75/15/100 nm, respectively) at the respective formation positions of the source electrode 108 and the drain electrode 109, and thereafter, heat treatment was carried out at 850° C. for 30 seconds in nitrogen in order to increase the ohmic property of each electrode of the source and the drain. Thus, the source electrode 108 and the drain electrode 109 were formed.

After formation of the source electrode 108 and the drain electrode 109, the vacuum evaporation method and photolithographic process were employed to form Schottky metal patterns of Pd/Au (30/100 nm thickness, respectively) at the formation positions of the gate electrode 107. Thus the gate electrode 107 was formed.

Accordingly, the HEMT devices 100 were obtained. With respect to the HEMT devices 100, the electric characteristics were evaluated in the same manner as in Inventive Example 1. FIG. 9 is a view showing the tabulated evaluation results of such electric characteristics. These results of FIG. 9 show that the HEMT devices 100 have been obtained as normally-on operation type HEMT devices.

Comparison of Inventive Example 1 and Comparative Example 1

In comparison of those having the same gate length among the HEMT devices 10 according to Inventive Example 1 shown in FIG. 7 and the HEMT devices 100 according to Comparative Example 1 shown in FIG. 9, it can be said that the HEMT devices 10 according to Inventive Example 1 satisfy a high threshold voltage of +3.2 V or more, while they have approximately same characteristics as those of the normally-on operation type HEMT devices 100.

Comparative Example 2

HEMT devices were fabricated in the same procedure as in Comparative Example 1, except that the thickness of the barrier layer 104 was changed to three levels; 5, 7.5, and 10 nm, and that those having the barrier layer 104 with a thickness of 5 nm were fabricated to have the gate length in four levels same as those of Inventive Example 1.

At the time when the substrates for device formation were fabricated in the respective fabrication conditions, a portion of each of the substrates was cut and subjected to hole measurement. As a result, the sheet resistance of each case of 5, 7.5, and 10 nm thickness of the barrier layer 104 was successively 1500, 900, and 750Ω/□ and the electron mobility of each case was 940, 960, and 980 $cm^2$/Vs, respectively.

With respect to the obtained HEMT devices, the electric characteristics were evaluated in the same manner as in Inventive Example 1. FIGS. 10 and 11 are views showing the tabulated evaluation results of such electric characteristics. These results of FIGS. 10 and 11 show that only HEMT devices having a thickness of the barrier layer (described as AlGaN film thickness in FIGS. 10 and 11) of 5 nm were obtained as a normally-off operation type HEMT device having a positive threshold voltage.

Comparison of Inventive Example 1 and Comparative Example 2

In comparison of those having the same gate length among the HEMT devices 10 according to Inventive Example 1 shown in FIGS. 6 and 7 and the HEMT devices according to Comparative Example 2 shown in FIGS. 10 and 11, it can be said that the HEMT devices according to Inventive Example 1 have a sufficiently higher threshold voltage than the HEMT devices according to Comparative Example 2 and a sufficiently lower on-resistance. With respect to the maximum current and the maximum mutual conductance, it is also understood that the HEMT devices 10 according to Inventive Example 1 have higher values. That is, it is concluded that the HEMT devices 10 according to Inventive Example 1 are normally-off operation type HEMT devices having better characteristics than the HEMT devices fabricated by thinning the barrier layer.

Inventive Example 2

In this Inventive Example, the HEMT devices 20 according to the second embodiment were fabricated in the same procedure as in Inventive Example 1, except that the base layer 3 was formed as a GaN layer having conductivity of P-type.

Formation of the GaN layer as the base layer 3 in this Inventive Example was carried out by heating the substrates 1 to 1100° C. and thereafter introducing each bubbling gas of $CP_2Mg$ and TMG as well as $NH_3$ gas into a reactor in the same manner as in Inventive Example 1. The thickness of the GaN layer was adjusted to be 1.5 μm. When a single GaN layer grown in the same condition was investigated, the hole concentration at room temperature was confirmed to be about $2 \times 10^{16}/cm^3$.

The substrates for device formation obtained by forming the base layer 3 and the barrier layer 4 were partially cut into a portion and the pattern was subjected to hole measurement before the latter stage treatment was carried out. The sheet resistance was 1500Ω/□ and the electron mobility was about 800 cm²/Vs.

With respect to the finally obtained HEMT devices 20, the devices were cut in parallel to the source-drain main current channel and the cross-sections thereof were observed by SEM and EDX. With the observation, it was confirmed that the PN junction interface existed in the outer side than the interface of the main P-type region 5a in the part of the barrier layer 4. That is, it was confirmed that the auxiliary P-type region 5b as a Mg diffusion region was formed.

Further, with respect to the finally obtained HEMT devices 20, the electric characteristics were evaluated in the same manner as Inventive Example 1. FIGS. 12 and 13 are the views showing the tabulated evaluation results of such electric characteristics. These results show that the HEMT devices 20 have been formed as normally-off operation type HEMT devices with a positive threshold voltage. In particular, according to FIG. 12, it can be understood that even if the base layer 3 had conductivity of P-type, normally-off operation type HEMT devices having a high threshold voltage of +3 V or more could be realized, in the case where the $SiO_2$ film was used as an insulating layer in the same manner as the case of Inventive Example 1, by adjusting the thickness of the insulating layer to be at least 5 nm or more. Further, according to FIG. 13, it can be understood that normally-off operation type HEMT devices having a high threshold voltage of +3 V or more could be realized, regardless of the gate length.

Comparison of Inventive Example 2 and Comparative Example 2

In comparison of those having the same gate length among the HEMT devices 20 according to Inventive Example 2 shown in FIGS. 12 and 13 and the HEMT devices according to Comparative Example 2 shown in FIGS. 10 and 11, it can be said that the HEMT devices 20 according to Inventive Example 2 are inferior in the maximum current and the maximum mutual conductance. It is supposedly attributed to that the electron mobility is low. However, the HEMT devices 20 according to Inventive Example 2 have a sufficiently higher threshold voltage than the HEMT devices according to Comparative Example 2. Accordingly, the HEMT devices 20 according to Inventive Example 2 can be said to be more excellent in terms of safety and reliability of the operation.

Inventive Example 3

The HEMT devices 30 according to the third embodiment were fabricated in the same procedure as in Inventive Example 1, except that an AlN layer 31 was formed between the base layer 3 and the barrier layer 4. The formation of the AlN layer 31 was carried out by keeping the substrate temperature at 1100° C. after formation of the GaN layer as the base layer 3 and introducing TMA bubbling gas as well as $NH_3$ gas into the MOCVD furnace. The thickness of the AlN layer 31 was adjusted to be 1 nm.

The substrates for device formation obtained by forming the base layer 3, the AlN layer 31, and the barrier layer 4 were partially cut into a portion and the portion was subjected to hole measurement before the latter stage treatment was carried out. The sheet resistance was 250Ω/□ and the electron mobility was about 2200 cm²/Vs.

With respect to the obtained HEMT devices 30, when the devices were cut in parallel to the source-drain main current channel and the cross-sections thereof were observed by SEM and EDX. With this observation, it was confirmed that the PN junction interface existed in the outer side than the interface of the main P-type region 5a. That is, it was confirmed that the auxiliary P-type region 5b as a Mg diffusion region was formed.

Further, with respect to the HEMT devices 30, the electric characteristics were evaluated in the same manner as in Inventive Example 1. FIGS. 14 and 15 are views showing the tabulated evaluation results of such electric characteristics.

The HEMT devices 30 had a high threshold voltage same as that of the HEMT devices 10 according to the first embodiment having no AlN layer 31 and slightly lowered on-resistance than that of the HEMT devices 10. Further, the maximum current and the maximum mutual conductance were slightly higher than those of the HEMT devices 10. That is, it can be said that the HEMT devices 30 according to this Inventive Example had more excellent characteristics than those of the HEMT devices 10 according to the first embodiment.

Inventive Example 4

In this Example, HEMT devices 10 according to the first embodiment were fabricated in the same procedure as in Inventive Example 1, except that the composition and thickness of the barrier layer 4 were changed. The thickness of the $SiO_2$ film as the insulating layer 6 was adjusted to be 5 nm and the gate length was adjusted to be 0.2 μm. At that time, measurement of the sheet resistance was carried out for substrates for device formation obtained by forming the base layer 3 and the barrier layer 4.

With respect to the obtained HEMT devices 10, the electric characteristics were evaluated in the same manner as in Inventive Example 1. FIG. 16 is a view showing the tabulated evaluation results of such electric characteristics together with the composition, thickness, and sheet resistance of the barrier layers 4 of the respective HEMT devices 10. FIG. 16 also shows the evaluation results for those having the same gate length as the thickness of the $SiO_2$ film among the HEMT devices 10 fabricated in Inventive Example 1.

From FIG. 16, it can be understood that in the case where the barrier layer 4 was formed with a Group III nitride, even if the composition and the thickness of the layer were varied, the HEMT devices 10 having a low on-resistance and a high withstand voltage of +3 V or more could be realized in the same manner as in Inventive Example 1. Further, since as the sheet resistance is smaller, the maximum current and the maximum mutual conductance are higher, the characteristics of the HEMT devices are found depending on the sheet resistance.

Inventive Example 5

In this Example, HEMT devices 10 were fabricated in the same procedure as in Inventive Example 1, except that the type of substances forming the insulating layer 6 (hereinafter, referred to also as insulating film type) and the thickness of the insulating layer were changed. The insulating film types were 4 types: $SiO_2$ film, $SiN_x$ film, $Al_2O_3$ film, and $HfO_2$ film. In all cases, the gate length was adjusted to be 0.2 μm. FIG. 17 collectively shows the insulating film types and their film formation methods, specific permittivitys, and the minimum film thickness for satisfying the equation (1) (rounding off the hundredth place).

With respect to the obtained HEMT devices 10, the threshold voltages were evaluated. FIG. 18 is a view showing the relation of the thickness of the insulating layer 6 and the threshold voltage with respect to the HEMT devices 10 forming the insulating layer 6 with respectively different type.

From FIG. 18, it can be understood that the threshold voltage was increased more as the thickness of the insulating layer 6 became thicker. Further, it can be understood that the normally-off operation type HEMT devices with having a high threshold voltage of +3 V or more could be realized regardless of the insulating film type by forming the insulating layer 6 to have the minimum film thickness or more as show in FIG. 17.

While the invention has been shown and described in detail, the foregoing description is in all aspects illustrative and not restrictive. It is therefore understood that numerous modifications and variations can be devised without departing from the scope of the invention.

What is claimed is:

1. A MIS gate structure type HEMT device comprising:
   (a) a semiconductor layer including:
      (a-1) a base layer made of a first Group III nitride and having conductivity of N-type and a specific resistance of $1\times10^7$ Ωcm or more, or having conductivity of P-type;
      (a-2) a barrier layer made of a second Group III nitride having a wider band gap than said first Group III nitride; and
      (a-3) a P-type region having conductivity of P type;
   (b) a source electrode and a drain electrode, formed on said barrier layer;
   (c) a gate electrode; and
   (d) an insulating layer located between said gate electrode and said semiconductor layer, wherein
   said barrier layer is formed adjacent to said base layer and said insulating layer,
   said base layer has a two-dimensional electron gas region in a periphery of an interface with said barrier layer, and
   said P-type region is formed immediately under said insulating layer and penetrates said barrier layer and said two-dimensional electron gas region in a range substantially concealed in said gate electrode when said gate electrode is observed in plane view from a surface side.

2. The MIS gate structure type HEMT device according to claim 1, wherein said P-type region comprises a main P-type region made of GaN containing Mg as an acceptor and an auxiliary P-type region which is a diffusion region of Mg contained in said main P-type region.

3. The MIS gate structure type HEMT device according to claim 1, wherein when a film thickness of said insulating layer is defined as t (nm) and a relative permittivity of a substance forming said insulating layer is defined as k, $k/t \leq 0.85$ (nm$^{-1}$).

4. The MIS gate structure type HEMT device according to claim 1, wherein said second Group III nitride is AlGaN.

5. The MIS gate structure type HEMT device according to claim 1, wherein said base layer is formed as a layer having conductivity of N-type using GaN as said first Group III nitride and having an electron concentration due to a remaining donor of $1\times10^{12}$/cm$^3$ or less.

6. The MIS gate structure type HEMT device according to claim 1, wherein an AlN layer having a thickness of 0.75 nm or more and 1.5 nm or less is formed between said base layer and said barrier layer.

7. A method of fabricating a MIS gate structure type HEMT device including an insulating layer between a gate electrode and a semiconductor layer, said method comprising the following steps:
   (a) forming a two-dimensional electron gas region of a base layer in a periphery of an interface with a barrier layer, said step (a) comprising the following steps:
      (a-1) forming said base layer having conductivity of N-type and a specific resistance of $1\times10^7$ Ωcm or more or conductivity of P-type by doping a first Group III nitride with a prescribed dopant;
      (a-2) forming said barrier layer using a second Group III nitride having a wider band gap than said first Group III nitride; and
   (b) forming a P-type region having a main P-type region and an auxiliary P-type region in a range substantially concealed in said gate electrode when said gate electrode is observed in plane view from a surface side,
   said auxiliary P-type region being a diffusion region of Mg contained in said main P-type region, said step (b) comprising the following steps:
      (b-1) removing a portion of said barrier layer and said base layer and thereafter forming said main P-type region made of GaN with doping Mg in a manner that a removed portion is embedded and a top face of an embedded portion is approximately continuous with a top face of said barrier layer; and
      (b-2) carrying out activation treatment for activating Mg doped in said main P-type region;
   (c) forming said insulating layer on a top face of said semiconductor layer; and
   (d) forming a source electrode and a drain electrode at prescribed positions of the top face of said barrier layer and forming a gate electrode at a prescribed position of a top face of said insulating layer.

8. The method of fabricating a MIS gate structure type HEMT device according to claim 7, wherein said insulating layer is formed in a manner that, when a film thickness of said insulating layer is defined as t (nm) and a relative permittivity of a substance forming said insulating layer is defined as k, $k/t \leq 0.85$ (nm$^{-1}$).

9. The method of fabricating a MIS gate structure type HEMT device according to claim 7, wherein said second Group III nitride is AlGaN.

10. The method of fabricating a MIS gate structure type HEMT device according to claim 7, wherein said base layer is formed as a layer having conductivity of N-type using GaN as said first Group III nitride and having an electron concentration due to a remaining donor of $1\times10^{12}$/cm$^3$ or less in said step (a-1).

11. The method of fabricating a MIS gate structure type HEMT device according to claim 7, wherein following step is inserted between said step (a-1) and said step (a-2):
   (a-3) forming an AlN layer having a thickness of 0.75 nm or more and 1.5 nm or less.

12. A MIS gate structure type HEMT device including an insulating layer between a gate electrode and a semiconductor layer, said HEMT device fabricated by the following steps:
   (a) forming a two-dimensional electron gas region of a base layer in a periphery of an interface with a barrier layer, said step (a) comprising the following steps:
      (a-1) forming said base layer having conductivity of N-type and a specific resistance of $1\times10^7$ Ωcm or more or conductivity of P-type by doping a first Group III nitride with a prescribed dopant; and
      (a-2) forming said barrier layer using a second Group III nitride having a wider band gap than said first Group III nitride; and
   (b) forming a P-type region having a main P-type region and an auxiliary P-type region in a range substantially concealed in said gate electrode when said gate electrode is observed in plane view from a surface side, said auxiliary P-type region being a diffusion region of Mg contained in said main P-type region, and comprising the following steps:
- (b-1) removing a portion of said barrier layer and said base layer and thereafter forming said main P-type region made of GaN with doping Mg in a manner that a removed portion is embedded and a top face of an embedded portion is approximately continuous with a top face of said barrier layer; and
- (b-2) carrying out activation treatment for activating Mg doped in said main P-type region;

(c) forming said insulating layer on a top face of said semiconductor layer; and (d) forming a source electrode and a drain electrode at prescribed positions of the top face of said barrier layer and forming a gate electrode at a prescribed position of a top face of said insulating layer.

13. The MIS gate structure type HEMT device according to claim 12, wherein said insulating layer is formed in a manner that, when a film thickness of said insulating layer is defined as t (nm) and a relative permittivity of a substance forming said insulating layer is defined as k, $k/t \leq 0.85$ (nm$^{-1}$).

14. The MIS gate structure type HEMT device according to claim 12, wherein said second Group III nitride is AlGaN.

15. The MIS gate structure type HEMT device according to claim 12, wherein said base layer is formed as a layer having conductivity of N-type using GaN as said first Group III nitride and having an electron concentration due to remaining donor in said step (a-1) of $1\times10^{12}$/cm$^3$ or less.

16. The MIS gate structure type HEMT device according to claim 12, wherein following step is inserted between said step (a-1) and said step (a-2):
- (a-3) forming an AlN layer having a thickness of 0.75 nm or more and 1.5 nm or less.

17. A MIS gate structure type HEMT device comprising:
(a) a semiconductor layer including:
- (a-1) a base layer made of a first Group III nitride and having conductivity of N-type and a specific resistance of $1\times10^7$ Ωcm or more, or having conductivity of P-type;
- (a-2) a barrier layer made of a second Group III nitride having a wider band gap than said first Group III nitride; and
- (a-3) a P-type region having conductivity of P type;

(b) a source electrode and a drain electrode, formed on said barrier layer;

(c) a gate electrode; and (d) an insulating layer located between said gate electrode and said semiconductor layer, wherein said barrier layer is formed adjacent to said base layer and said insulating layer, said base layer has a two-dimensional electron gas region in a periphery of an interface with said barrier layer, and said P-type region is formed immediately under said insulating layer and has a larger thickness than said barrier layer in a range substantially concealed in said gate electrode when said gate electrode is observed in plane view from a surface side.

* * * * *